United States Patent
Yoon et al.

(10) Patent No.: US 7,229,869 B2
(45) Date of Patent: Jun. 12, 2007

(54) METHOD FOR MANUFACTURING A SEMICONDUCTOR DEVICE USING A SIDEWALL SPACER ETCHBACK

(75) Inventors: Jong Shik Yoon, Plano, TX (US); Shirin Siddiqui, Plano, TX (US); Amitava Chatterjee, Plano, TX (US); Brian E. Goodlin, Dallas, TX (US); Karen H. R. Kirmse, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 92 days.

(21) Appl. No.: 11/074,905

(22) Filed: Mar. 8, 2005

(65) Prior Publication Data

US 2006/0205169 A1   Sep. 14, 2006

(51) Int. Cl.
  *H01L 21/8234* (2006.01)
(52) U.S. Cl. .................. 438/197; 438/303; 438/306
(58) Field of Classification Search ............... 438/197, 438/299, 303; 257/288, 336
  See application file for complete search history.

(56) References Cited

U.S. PATENT DOCUMENTS

| | | | | |
|---|---|---|---|---|
| 6,015,741 A | * | 1/2000 | Lin et al. | 438/305 |
| 6,156,598 A | * | 12/2000 | Zhou et al. | 438/231 |
| 6,197,648 B1 | * | 3/2001 | Kasai et al. | 438/305 |
| 6,287,924 B1 | * | 9/2001 | Chao et al. | 438/300 |
| 6,551,887 B2 | * | 4/2003 | Kwon et al. | 438/305 |
| 7,018,888 B2 | | 3/2006 | Goodlin et al. | |
| 7,064,085 B2 | * | 6/2006 | Chiu et al. | 438/775 |
| 2004/0026747 A1 | * | 2/2004 | Maki et al. | 257/384 |
| 2006/0019456 A1 | | 1/2006 | Bu et al. | |

* cited by examiner

*Primary Examiner*—Tuan H. Nguyen
(74) *Attorney, Agent, or Firm*—Rose Alyssa Keagy; W. James Brady; Frederick J. Telecky, Jr.

(57) ABSTRACT

The present invention provides a method for manufacturing a semiconductor device and a method for manufacturing an integrated circuit. The method for manufacturing the semiconductor device, among other steps, includes forming a gate structure (130) over a substrate (110), the gate structure (130) having L-shaped sidewall spacers (430) on opposing sidewalls thereof and placing source/drain implants (310 or 510) into the substrate (110) proximate the gate structure (130). The method for manufacturing the semiconductor device further includes removing at least a portion of a horizontal segment of the L-shaped sidewall spacers (430).

30 Claims, 6 Drawing Sheets

METHOD FOR MANUFACTURING A SEMICONDUCTOR DEVICE USING A SIDEWALL SPACER ETCHBACK

TECHNICAL FIELD OF THE INVENTION

The present invention is directed, in general, to a semiconductor device and, more specifically, to a method for manufacturing a semiconductor device using a sidewall spacer etchback and a method for manufacturing an integrated circuit using the same.

BACKGROUND OF THE INVENTION

As CMOS technology continues to scale further into the sub-micron region, the width of active regions between adjacent gates structures of metal oxide semiconductor (MOS) transistors and the width of the active regions between the gate structures and field regions is constantly being reduced. Unfortunately, as the widths reduce, the resistances of these regions rise due to the regions being narrower. The increased resistance is becoming a major limitation of the MOS transistor performance.

In tune with the reduction in the width of active regions between adjacent gates structures of metal oxide semiconductor (MOS) transistors and the width of the active regions between the gate structures and field regions, the scaling of CMOS technology also desires that the width of the sidewall structures located along the sidewalls of the gate structures be reduced. The width of the sidewall structures, however, determines how far from the edge of the gate structures the deep source/drain regions are located. Nevertheless, due to the diffusion of dopants, the thermal annealing process designed to activate the dopants in the polysilicon gate and the deep source/drain regions of the MOS transistors typically pushes the edge of the deep source/drain regions towards each other and towards the edge of the transistor gate structure. If the deep source/drain regions get too close to each other, undesirable enhanced leakage may result when the transistor is in its off state. Reducing the width of the sidewall structures is therefore typically limited by the thermal diffusion process that takes place during the annealing that occurs after the formation of the deep source/drain regions.

As CMOS technology continues to scale there is therefore an increasing need for a method to reduce the width of the sidewall spacers without causing the source/drain regions to be positioned in such a location as to negatively affect the MOS transistor.

SUMMARY OF THE INVENTION

To address the above-discussed deficiencies of the prior art, the present invention provides a method for manufacturing a semiconductor device and a method for manufacturing an integrated circuit. The method for manufacturing the semiconductor device, among other steps, includes forming a gate structure over a substrate, the gate structure having L-shaped sidewall spacers on opposing sidewalls thereof, and placing source/drain implants into the substrate proximate the gate structure. The method for manufacturing the semiconductor device further includes removing at least a portion of a horizontal segment of the L-shaped sidewall spacers.

As previously stated, the present invention further provides a method for manufacturing an integrated circuit. In addition to the steps included within the method for manufacturing a semiconductor device, stated above, the method for manufacturing the integrated circuit includes forming dielectric layers having interconnects therein over the semiconductor devices to form an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
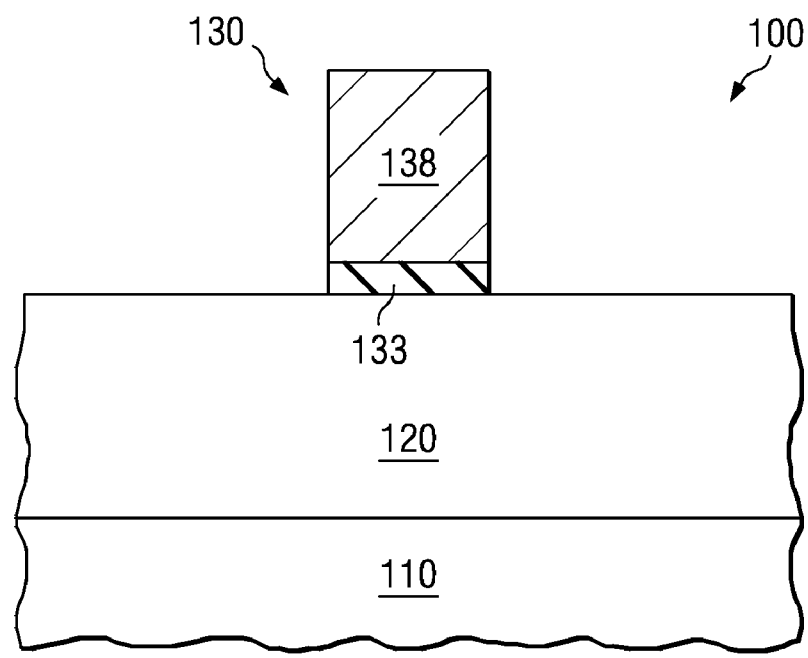
FIG. 1 illustrates a cross-sectional view of a partially completed semiconductor device manufactured in accordance with the principles of the present invention.

The present invention is based in part on a collection of individual ideas that were never really appreciated for what they added, and therefore were never brought together prior to the identification of the present invention. One idea is based upon the recognition that semiconductor device performance may be increased by reducing the sidewall spacer thickness, particularly with respect to L-shaped sidewall spacers, of the semiconductor device. In one scenario, the sidewall spacer thickness of the semiconductor device is reduced after implanting and thermally annealing the source/drain regions in the substrate. It has been observed that such a process allows the deep source/drain implants to be spaced further from the channel region of the metal oxide semiconductor field effect transistor (MOSFET). Consequently, a higher dose dopant and/or higher temperature anneal may be used, which improves MOSFET performance by reducing parasitic series resistance and reducing depletion regions in the poly. Additionally, it also reduces the off-state leakage, which allows one to reduce the channel doping density. Furthermore, this process substantially reduces the resistance that occurs in the active region between the poly lines, substantially reduces "wormhole defects" caused by oxide recesses formed in the field oxide between the sidewall spacers of adjacent gates, and allows a thicker pre-metal dielectric (PMD) liner (e.g., used as a contact etch stop layer) to be formed over and between adjacent semiconductor devices. Therefore, more strain may advantageously be incorporated in the channel region of the MOS transistors.

Another idea is based upon the recognition that the L-shaped geometry of the sidewall spacers provides advantageous results in MOS transistors. For example, the L-shaped geometry facilitates hydrogen outdiffusion away from the source/drain regions, especially in the case of p-channel metal oxide semiconductor (PMOS) devices, increases the device performance thereof.

The present invention, in contrast to the prior art, made the recognition that these two significant ideas could be used together to manufacture exemplary semiconductor devices. Specifically, the present invention recognized that increased semiconductor device performance, even above the performance obtainable using the two ideas mentioned above individually, may be attained by using the L-shaped spacer and an etchback thereof. For example, one embodiment exists wherein the source/drain implants are formed in the substrate using the L-shaped sidewall spacer, then the sidewall thickness of the L-shaped sidewall spacers is reduced and the source/drain implants annealed to form source/drain regions. As the source/drain implants are annealed after the reduction in width of the sidewall spacers, an increased amount of hydrogen is allowed to outgas away from the substrate. As an increased amount of hydrogen outdiffusion occurs, the semiconductor device performance also increases.

The present invention, however, further recognized that advantages may be achieved in certain instances wherein the width of the L-shaped sidewall spacer is reduced first, and then the source/drain implants are formed in the substrate. Specifically, the present invention recognized that the overhang of the sidewall spacer portion remaining over the reduced width sidewall spacer may substantially reduce the number of dopants penetrating there through and reaching the silicon there below when forming the source/drain regions. As one would expect, this also has its advantages.

Accordingly, semiconductor devices manufactured using the methodologies of the present invention take advantage of the sidewall spacer etchback, as well as the advantages of the L-shape such as increased hydrogen outdiffusion caused by the annealing of the source/drain implants after the sidewall spacer etchback. Therefore, the present invention, in one aspect, provides a method to etchback the spacer to reduce resistance problems, "wormhole defect" problems, and PMD liner problems. Additionally, the method allows for good control of the sidewall spacer critical dimension (CD) during source/drain implant and after sidewall spacer etchback. Likewise, it allows for hydrogen diffusion from the source/drain implant regions during anneal.

Turning now to FIGS. 1-9 illustrated are cross-sectional views of detailed manufacturing steps illustrating how one might manufacture a semiconductor device in accordance with the principles of the present invention. FIG. 1 illustrates a cross-sectional view of a partially completed semiconductor device 100 manufactured in accordance with the principles of the present invention. From the outset, it should be noted that the embodiments of FIGS. 1-9 will be discussed as a p-channel metal oxide semiconductor (PMOS) device. In an alternative embodiment, all the dopant types, except for possibly the substrate dopant, could be reversed, resulting in an n-channel metal oxide semiconductor (NMOS) device. However, at least with regard to FIGS. 1-9, no further reference to this opposite scheme will be discussed.

In the advantageous embodiment shown, the partially completed semiconductor device 100 of FIG. 1 includes a substrate 110. The substrate 110 may, in an exemplary embodiment, be any layer located in the partially completed semiconductor device 100, including a wafer itself or a layer located above the wafer (e.g., epitaxial layer). In the embodiment illustrated in FIG. 1, the substrate 110 is a p-type substrate; however, one skilled in the art understands that the substrate 110 might be an n-type substrate without departing from the scope of the present invention.

Located within the substrate 110 in the embodiment shown in FIG. 1 is a well region 120. The well region 120 in the embodiment illustrated in FIG. 1 contains an n-type dopant. For example, the well region 120 would likely be doped with an n-type dopant dose ranging from about 1E13 atoms/cm$^2$ to about 1E14 atoms/cm$^2$ and at an energy ranging from about 100 keV to about 500 keV. This results in the well region 120 having a peak dopant concentration ranging from about 5E17 atoms/cm$^3$ to about 1E19 atoms/cm$^3$.

Located over the substrate 110 in the embodiment of FIG. 1 is a gate structure 130. The gate structure 130 includes a gate dielectric layer 133 and a polysilicon gate electrode layer 138. The gate dielectric layer 133 may comprise a number of different materials and stay within the scope of the present invention. For example, the gate dielectric layer 133 may comprise silicon dioxide, or in an alternative embodiment comprise a high dielectric constant (k) material. In the illustrative embodiment of FIG. 1, however, the gate dielectric layer 133 is a silicon dioxide layer having a thickness ranging from about 0.5 nm to about 5 nm.

Any one of a plurality of manufacturing techniques could be used to form the gate dielectric layer 133. For example, the gate dielectric layer 133 may be either grown or deposited. Additionally, the growth or deposition steps may require a significant number of different temperatures, pressures, gasses, flow rates, etc.

While the advantageous embodiment of FIG. 1 discloses that the polysilicon gate electrode layer 138 comprises standard polysilicon, other embodiments exist where the polysilicon gate electrode layer 138 or at least a portion thereof, comprises amorphous silicon. The amorphous silicon embodiment may be particularly useful when a substantially planar upper surface of the polysilicon gate electrode layer 138 is desired.

The deposition conditions for the polysilicon gate electrode layer 138 may vary, however, if the polysilicon gate electrode layer 138 were to comprise standard polysilicon, such as the instance in FIG. 1, the polysilicon gate electrode layer 138 could be deposited using a pressure ranging from about 100 torr to about 300 torr, a temperature ranging from about 620° C. to about 700° C., and a $SiH_4$ or $Si_2H_6$ gas flow ranging from about 50 sccm to about 150 sccm. If, however, amorphous silicon were desired, the amorphous silicon gate electrode could be deposited using a pressure ranging from about 100 torr to about 300 torr, a temperature ranging from about 450° C. to about 550° C., and a $SiH_4$ or $Si_2H_6$ gas flow ranging from about 100 sccm to about 300 sccm. In any instance, the polysilicon gate electrode layer 138 desirably has a thickness ranging from about 50 nm to about 150 nm.

Figure 2:
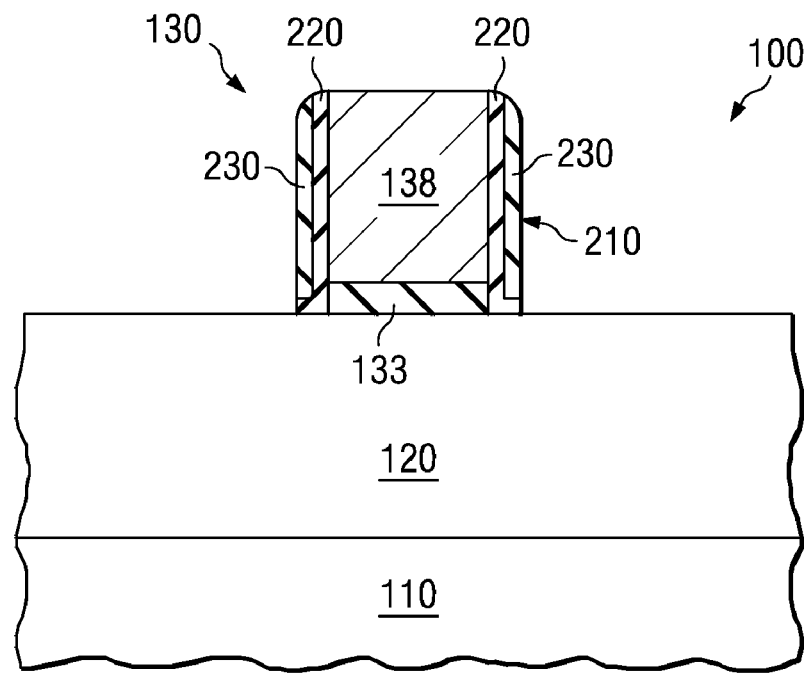
FIG. 2 illustrates a cross-sectional view of the partially completed semiconductor device illustrated in FIG. 1 after formation of source/drain extension offset spacers.

Turning briefly to FIG. 2, illustrated is a cross-sectional view of the partially completed semiconductor device 100 illustrated in FIG. 1 after formation of source/drain extension offset spacers 210. The source/drain extension offset spacers 210 shown in FIG. 2 include a conventional oxide layer 220 and an offset nitride spacer 230. In an exemplary process, the oxide layer 220 is initially formed using a combination of oxidation and deposition processes. In an alternative embodiment, however, the entire oxide layer 220 is either grown or deposited.

The offset nitride spacer 230 may comprise a standard silicon nitride spacer or a silicon nitride layer having carbon therein. If the offset nitride spacer 230 were to contain the carbon, the carbon might form from about 5% to about 10% of the layer. While the oxide layer 220 and the offset nitride spacer 230 are shown located only along the sides of the gate structure 130, those skilled in the art are aware that the layers were previously blanket formed and subsequently anisotropically etched to form the oxide layer 220 and the offset nitride spacer 230. It should be noted that certain embodiments might exist where the blanket oxide layer 220 and blanket nitride layer 230 would remain at this point and not be anisotropically etched as shown in FIG. 2. It should be further noted that there may be embodiments wherein the blanket nitride layer 230 is anisotropically etched and the etch stops on the blanket oxide layer 220. Thereafter, the blanket oxide layer 220 may or may not be removed using a conventional process that might occur after the anisotropic etch.

Figure 3:
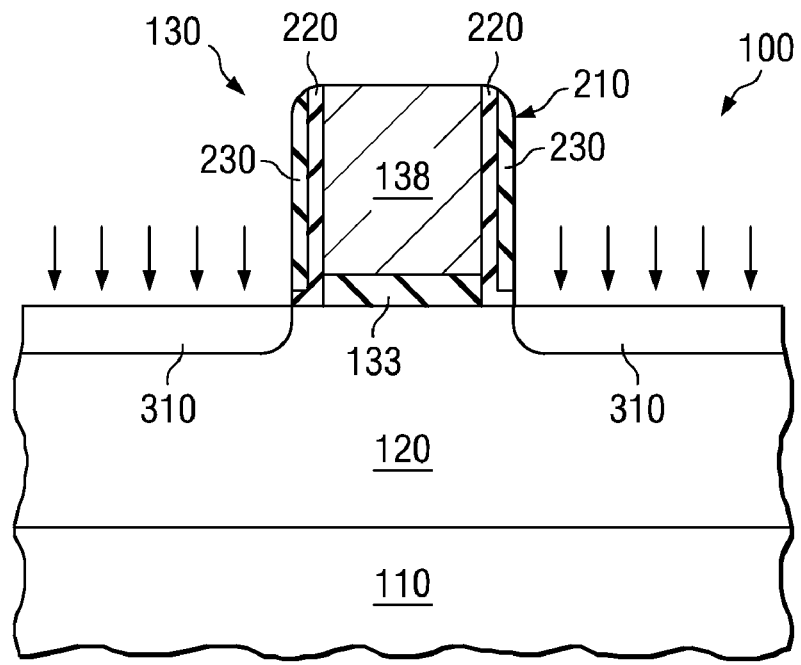
FIG. 3 illustrates a cross-sectional view of the partially completed semiconductor device illustrated in FIG. 2 after formation of source/drain extension implants within the substrate.

Turning now to FIG. 3, illustrated is a cross-sectional view of the partially completed semiconductor device 100 illustrated in FIG. 2 after formation of source/drain extension implants 310 within the substrate 110. The source/drain extension implants 310 are conventionally formed and generally have a peak dopant concentration ranging from about $1E19$ atoms/cm$^3$ to about $2E20$ atoms/cm$^3$. As is standard in the industry, the source/drain extension implants 310 have a dopant type opposite to that of the well region 120 they are located within. Accordingly, the source/drain extension implants 310 are doped with a P-type dopant in the illustrative embodiment shown in FIG. 3. It is also common to co-implant other dopants at this point in the flow. In particular, halo or pocket implants, whether at angles or not, may also be conducted at this point.

Figure 4:
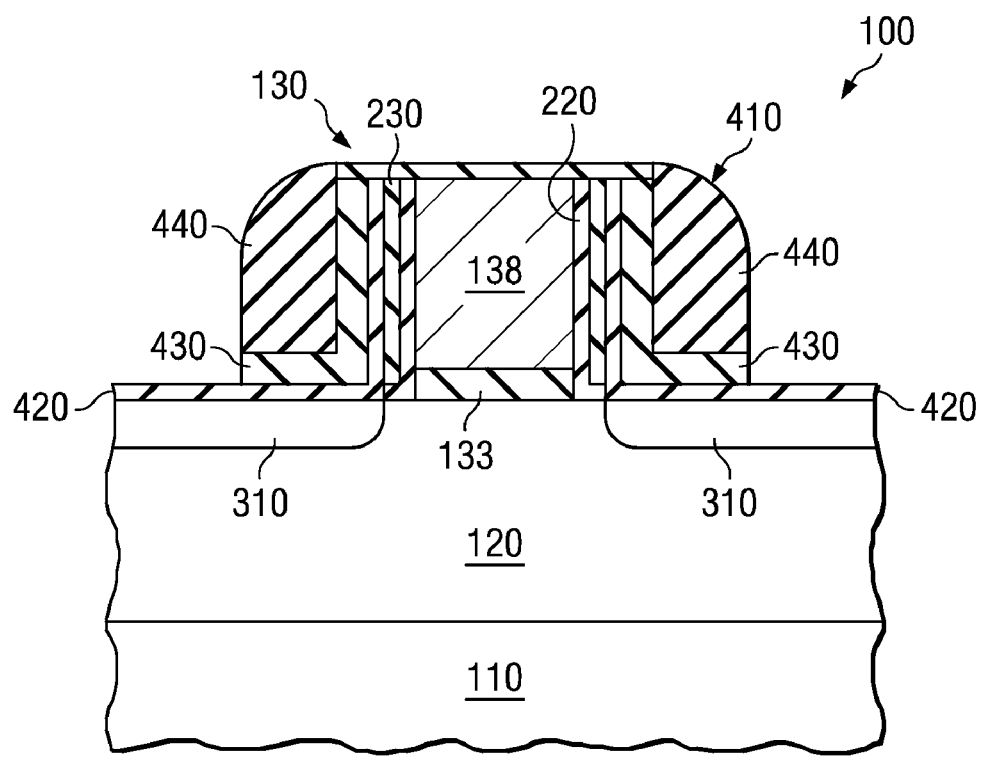
FIG. 4 illustrates a cross-sectional view of the partially completed semiconductor device illustrated in FIG. 3 after forming source/drain sidewall spacers.

Turning now to FIG. 4, illustrated is a cross-sectional view of partially completed semiconductor device 100 illustrated in FIG. 3 after forming source/drain sidewall spacers 410. In the illustrative embodiment, the source/drain sidewall spacers 410 comprise a cap oxide 420, L-shaped sidewall spacers 430 and sidewall oxides 440. The cap oxide 420, among other purposes, has the job of preventing the L-shaped sidewall spacers 430, which often comprise a nitride, from directly contacting the substrate 110. Most likely, the cap oxide 420 will be deposited over the partially completed semiconductor device 100 using a process similar to that used to form the oxide layer 220.

The L-shaped sidewall spacers 430 may comprise any type of material; however, in an exemplary embodiment the L-shaped sidewall spacers 430 comprise a nitride, which in an advantageous embodiment includes carbon. The carbon content, which may range from about 5% to about 10% of the L-shaped sidewall spacers 430, is included within the L-shaped sidewall spacers 430 to change the rate at which they etch. In the embodiment where the L-shaped sidewall spacers 430 include carbon, the L-shaped sidewall spacers 430 may be deposited using bis t-butylaminosilane (BT-BAS) and ammonia ($NH_3$) precursors in a CVD reactor. The carbon typically causes the L-shaped sidewall spacers 430 to etch at a slower rate than a traditional nitride layer. In an exemplary situation, after having been annealed using a temperature ranging from about 1000° C. to about 1100° C., the carbon causes the L-shaped sidewall spacers 430 to have an etch selectivity of about 50:1 when compared to the traditional nitride layer. In an alternative embodiment, a conventional rapid thermal chemical vapor deposition (RTCVD) process could be used to form the L-shaped sidewall spacers 430. This process has the advantage of being less expensive than the process including carbon. Other embodiments also exist where the L-shaped sidewall spacers 430 do not comprise a nitride or do not contain the carbon.

The sidewall oxides 440 that are located over the L-shaped sidewall spacers 430 are conventional. In the given embodiment of FIG. 4, the sidewall oxides 440 were blanket deposited and then subjected to an anisotropic etch. In this embodiment, the anisotropic etch also etches the L-shaped sidewall spacers 430 and cap oxide 420 located therebelow.

Figure 5:
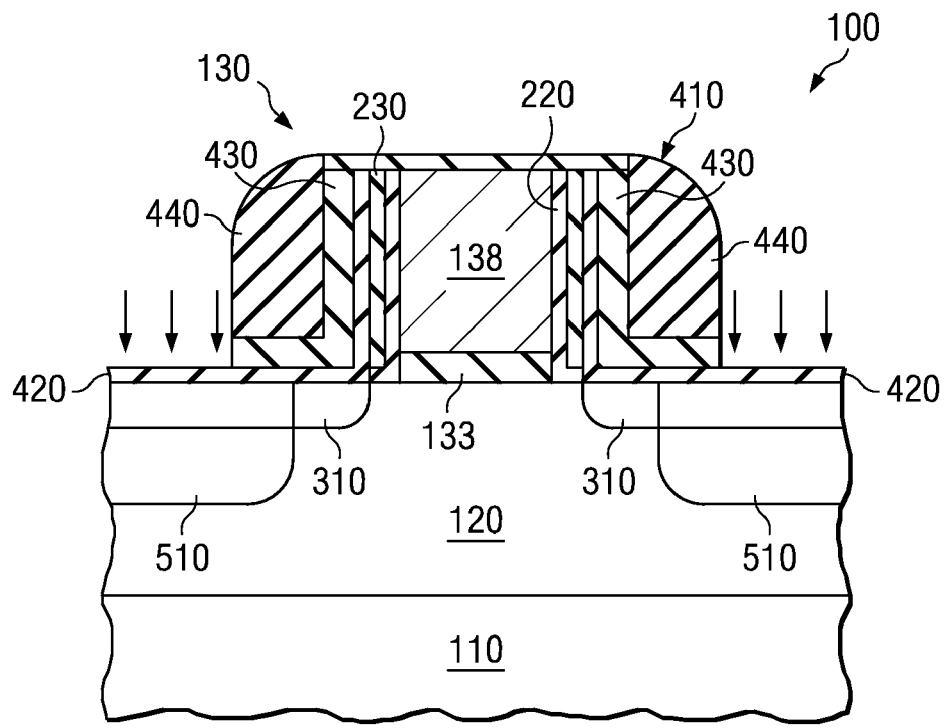
FIG. 5 illustrates a cross-sectional view of the partially completed semiconductor device illustrated in FIG. 4 after the formation of highly doped source/drain implants within the substrate.

Turning now to FIG. 5, illustrated is a cross-sectional view of the partially completed semiconductor device 100 illustrated in FIG. 4 after the formation of highly doped source/drain implants 510 within the substrate 110. Those skilled in the art understand the conventional processes that could be used to form the highly doped source/drain implants 510. Generally the highly doped source/drain implants 510 have a peak dopant concentration ranging from about $1E18$ atoms/cm$^3$ to about $1E21$ atoms/cm$^3$. Also, the highly doped source/drain implants 510 should typically have a dopant type opposite to that of the well region 120 they are located within. Accordingly, in the illustrative embodiment shown in FIG. 5, the highly doped source/drain implants 510 are doped with a p-type dopant.

Figure 6:
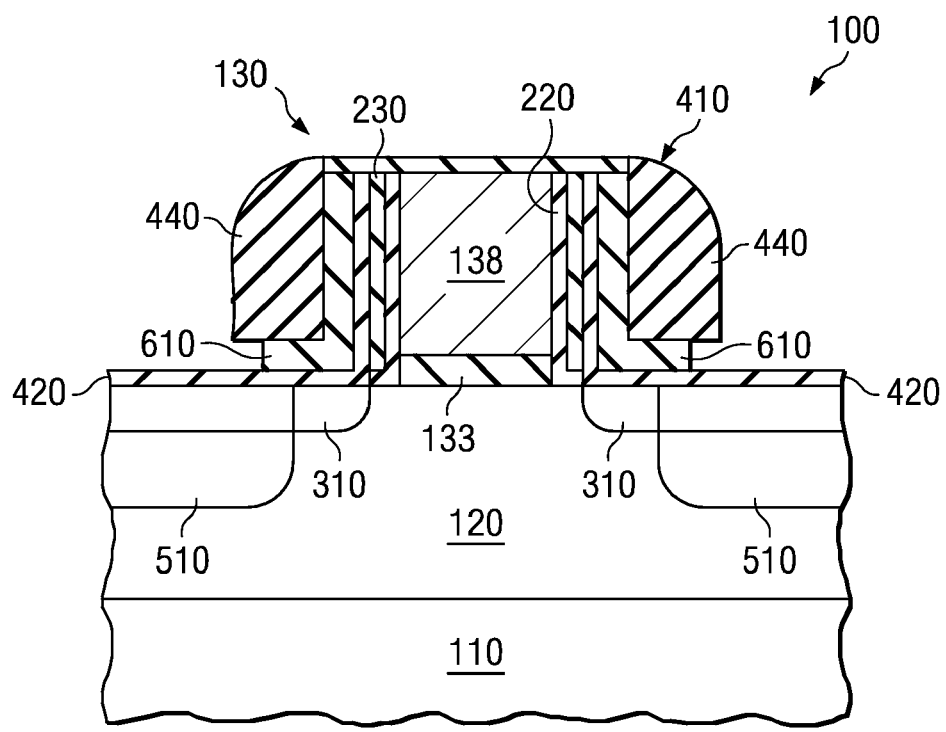
FIG. 6 illustrates a cross-sectional view of the partially completed semiconductor device illustrated in FIG. 5 after removing at least a portion of the L-shaped sidewall spacers.

Turning now to FIG. 6, illustrated is a cross-sectional view of the partially completed semiconductor device 100 illustrated in FIG. 5 after removing at least a portion of the L-shaped sidewall spacers 430, thus forming etched L-shaped sidewall spacers 610. In the particular embodiment shown, a horizontal segment of the L-shaped sidewall spacers 430 is removed. The horizontal segment, as one would expect and is shown in FIG. 6, is the portion of the L-shaped sidewall spacer that is in contact with the substrate 110, as compared to the portion in contact with the gate structure 130. In an advantageous embodiment, up to about 30 nm of each of the horizontal segments of the L-shaped sidewall spacers 430 is removed. In an even more advantageous embodiment, from about 5 nm to about 10 nm of each of the horizontal segments of the L-shaped sidewall spacers 430 is removed.

Those skilled in the art understand the processes that could be used to remove at least a portion of each of the L-shaped sidewall spacers 430. In the embodiment of FIG. 6 a wet etch has been used to remove at least a portion of each of the L-shaped sidewall spacers 430. In this embodiment, the wet etch should have a high etch rate towards the L-shaped spacers 430, as compared to the cap oxide 420. This selectivity will allow the wet etchant to remove at least a portion of the L-shaped sidewall spacers 430 leaving the cap oxide 420 substantially intact. As the cap oxide 420 is present, it materially protects the underlying silicon from the wet etchant. If the underlying silicon were exposed to the wet etchant, undesirable pits might form therein. In one embodiment hot phosphoric acid, or another similar wet etch (e.g., hot 1000:1 HF), could be used. Another alternative etch process could be hydrofluoric acid combined with ethylene glycol.

Figure 7:
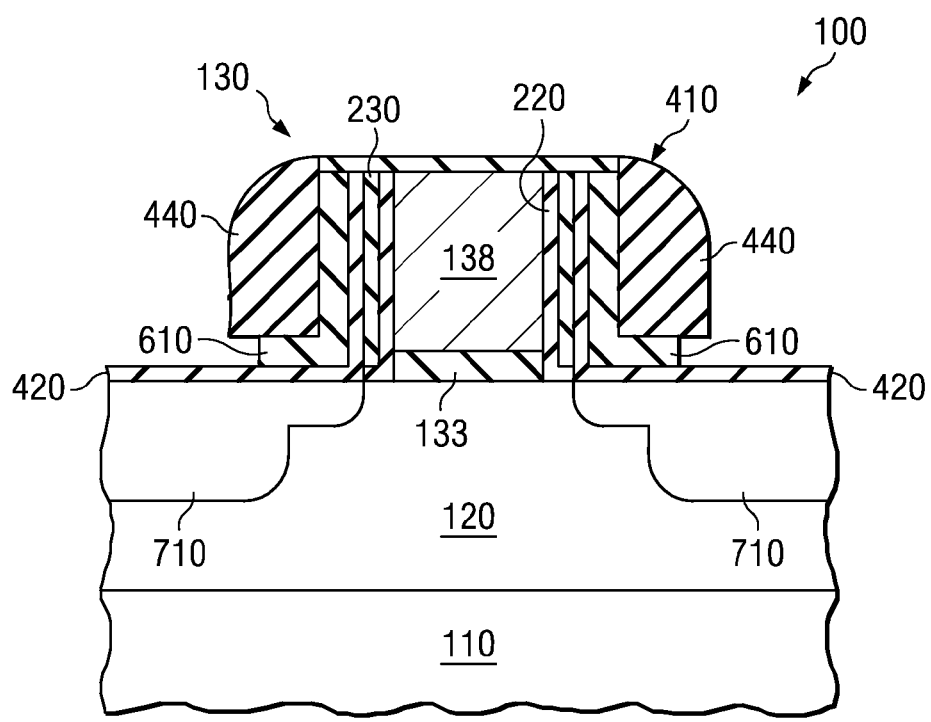
FIG. 7 illustrates a cross-sectional view of the partially completed semiconductor device illustrated in FIG. 6 after annealing the deep source/drain implants and source/drain extension implants to form source/drain regions, as well as reduce crystal defects caused by the implants.

Turning now to FIG. 7, illustrated is a cross-sectional view of the partially completed semiconductor device 100 illustrated in FIG. 6 after annealing the deep source/drain implants 510 and source/drain extension implants 310 to form source/drain regions 710. Generally, thermal anneal procedures are based on the principle of radiation heating. The semiconductor device 100 is placed in a chamber fitted with gas inlets and exhaust outlets. Inside the chamber, a heat source provides the desired heating for a specified period of time. Heat sources include graphite heaters, microwave, plasma arc, tungsten halogen lamps, and the like. In the current embodiment, this thermal source/drain anneal is conducted at a temperature of greater than about 800° C., and in one advantageous embodiment a temperature ranging from about 900° C. to about 1300° C. Often the thermal anneal is a spike anneal, "refined" spike anneal or a flash anneal, however, other timed anneals might also be used. It should be noted that not only does the anneal activate the source/drain regions 710, it also substantially fixes any silicon imperfections caused by the previous implantation processes. It should be noted that certain embodiments exist where the anneal occurs prior to the etchback step described above. Such situation would be within the scope of the present invention.

The embodiment disclosed with respect to FIGS. 4-7 above represents only a single embodiment of the present invention. For instance, another embodiment exists wherein the etchback of the L-shaped sidewall spacer 430 occurs prior to the formation of the highly doped source/drain implants 510. In this instance the sidewalls oxides 440 may prevent a substantial portion of the dopants from reaching undesirable areas under the gate structure 130. After the highly doped source/drain implants are formed they may be annealed in a process similar to that discussed above in FIG. 7. Other embodiments, neither discussed nor shown, may also exist and would be within the scope of the present invention.

Figure 8:
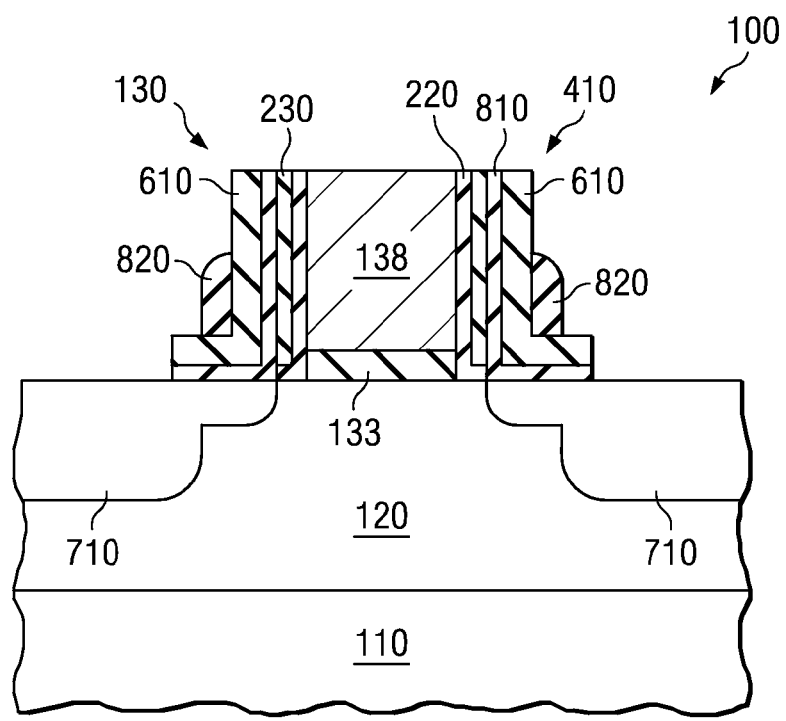
FIG. 8 illustrates a cross-sectional view of the partially completed semiconductor device illustrated in FIG. 7 after one or more etches that expose the surface of the polysilicon gate and the surface of the silicon in the active regions.

Turning now to FIG. 8, illustrated is a cross-sectional view of the partially completed semiconductor device 100 illustrated in FIG. 7 after one or more etches that expose the surface of the gate electrode layer 138 and the surface of the silicon in the active regions, and thus forming etched cap oxide 810. Advantageous to the present invention, the cap oxide 420, prior to it being etched to form the etched cap oxide 810, substantially protects the substrate 110 from the etch used to remove the portion of the L-shaped sidewall spacers 430. Those skilled in the art understand the process and chemistry that could be used to etch the cap oxide 420. At the same time the etch removes the exposed portions of the cap oxide 420, the same etch is capable of modifying the sidewall oxide 440 to be modified sidewall oxides 820. As is illustrated, the modified sidewall oxides 820 are now smaller in size.

Figure 9:
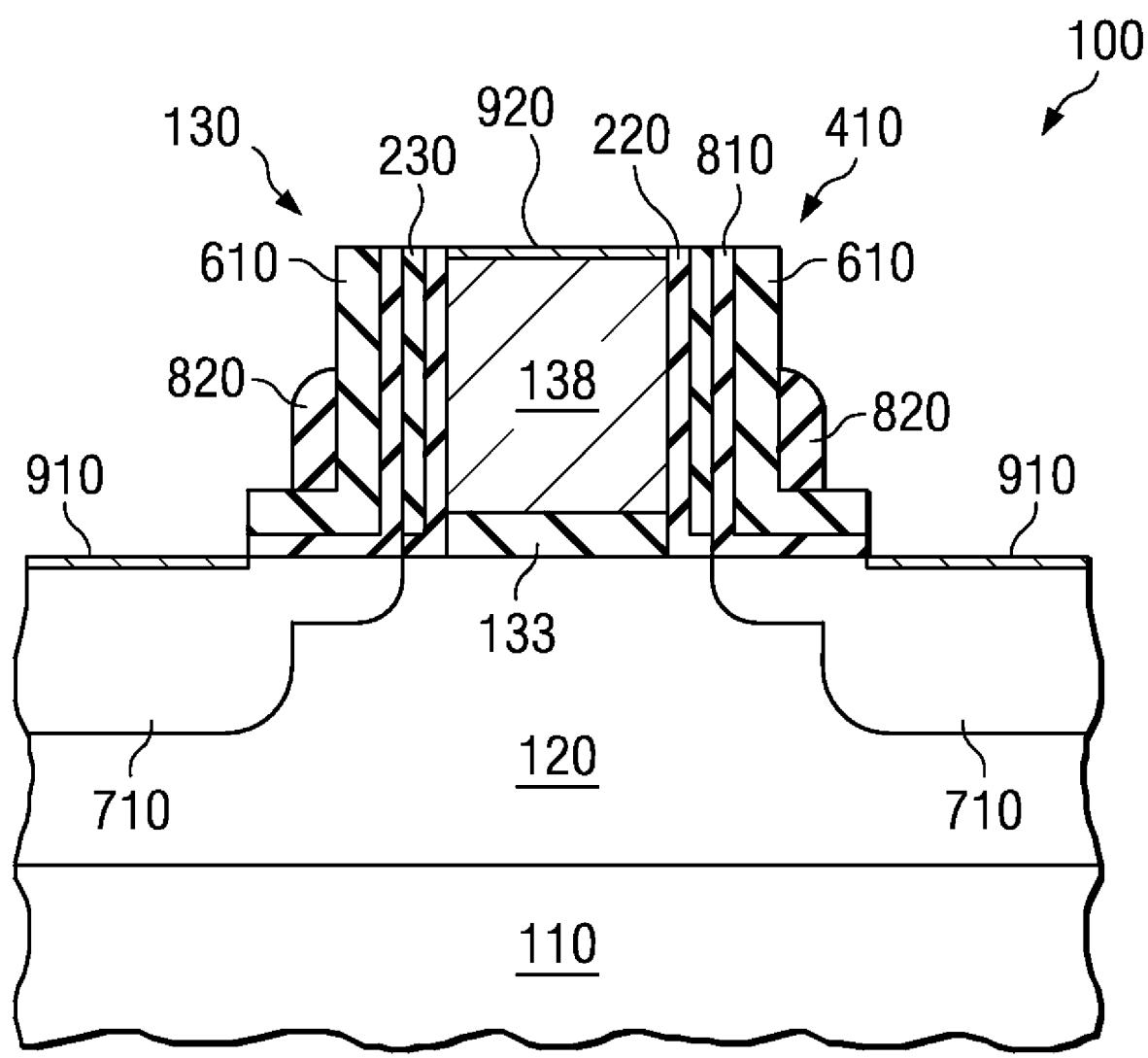
FIG. 9 illustrates a cross-sectional view of the partially completed semiconductor device illustrated in FIG. 8 after conventionally forming silicided active regions and a silicided gate electrode.

Turning now to FIG. 9, illustrated is a cross-sectional view of the partially completed semiconductor device 100 illustrated in FIG. 8 after conventionally forming silicided active regions 910 and a silicided gate electrode layer 920. The skilled artisan understands the conventional silicided active region 910 and silicided gate electrode layer 920 formation process. In sum, the process includes forming a metal layer, possibly cobalt, nickel, etc., over the substrate 110 and gate structure 130, and subjecting the metal layer to an anneal, causing the metal to react with the silicon of the substrate 110, and in this instance the gate electrode layer 138, and form the silicided active regions 910 and silicided gate electrode layer 920.

Figure 10:
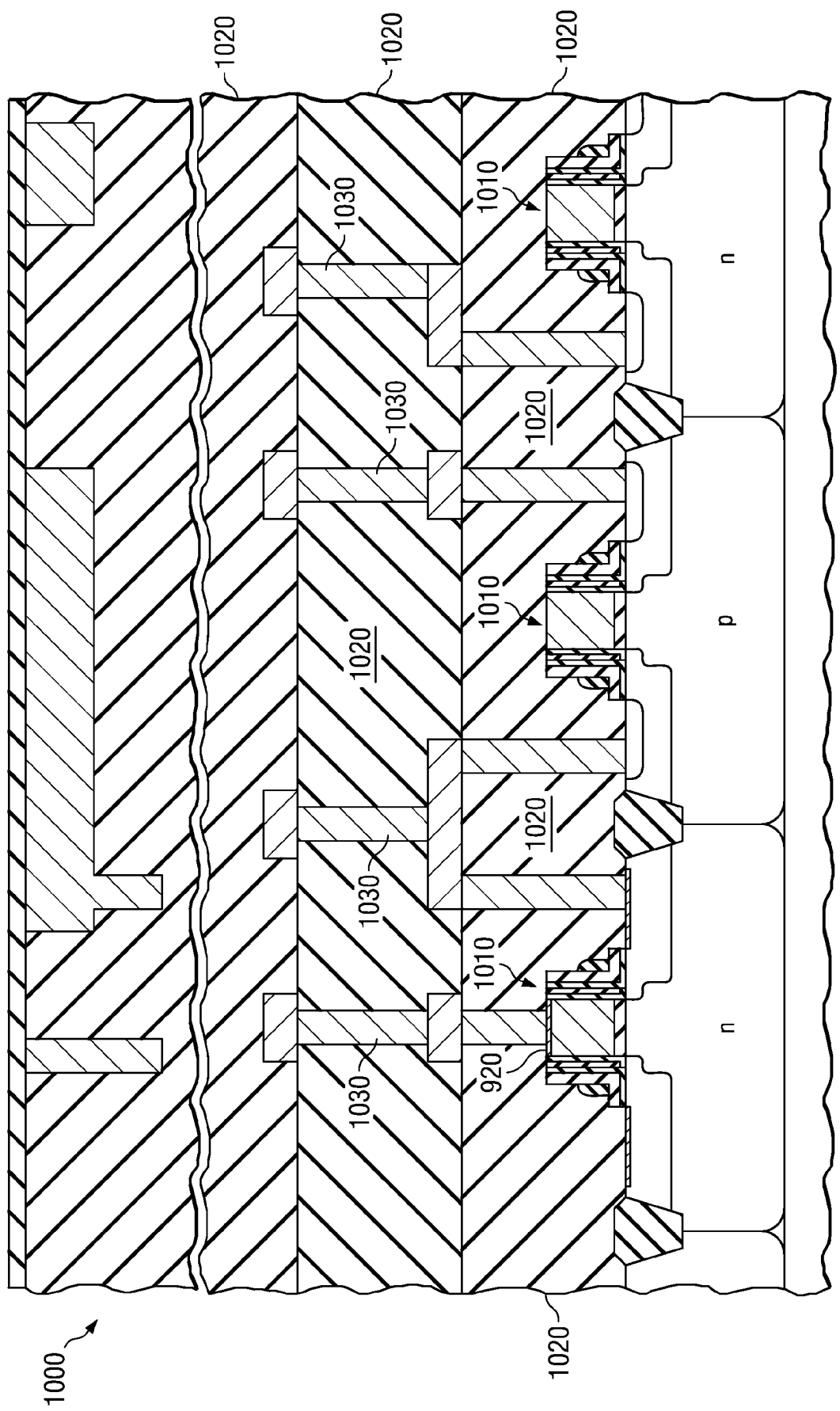
FIG. 10 illustrates a cross-sectional view of a conventional integrated circuit (IC) incorporating a semiconductor device constructed according to the principles of the present invention.

Referring finally to FIG. 10, illustrated is a cross-sectional view of a conventional integrated circuit (IC) 1000 incorporating a semiconductor device 1010 constructed according to the principles of the present invention. The IC 1000 may include devices, such as transistors used to form CMOS devices, BiCMOS devices, bipolar devices, or other types of devices. The IC 1000 may further include passive devices, such as inductors or resistors, or it may also include optical devices or optoelectronic devices. Those skilled in the art are familiar with these various types of devices and their manufacture. In the particular embodiment illustrated in FIG. 10, the IC 1000 includes the semiconductor device 1010 having dielectric layers 1020 located thereover. Additionally, interconnect structures 1030 are located within the dielectric layers 1020 to interconnect various devices, thus, forming the operational integrated circuit 1000.

Although the present invention has been described in details, those skilled in the art should understand that they could make various changes, substitutions and alterations herein without departing from the spirit and scope of the invention in its broadest form.

What is claimed is:

1. A method for manufacturing a semiconductor device, comprising:
    forming a gate structure over a substrate, the gate structure having L-shaped sidewall spacers on opposing sidewalls thereof, the gate structure also having sidewall oxides coupled to the L-shaped sidewall spacers;
    placing source/drain implants into the substrate proximate the gate structure;
    removing at least a portion of a horizontal segment of the L-shaped sidewall spacers, wherein the L-shaped sidewall spacers are still L-shaped after the removing step; and
    etching the sidewall oxides after the step of removing at least a portion of a horizontal segment of the L-shaped sidewall spacers, wherein the outside edge of the etched sidewall oxides does not extent past the outside edge of the horizontal segment of the L-shaped sidewall spacers.

2. The method as recited in claim 1 wherein the removing the at least the portion of the horizontal segment of the L-shaped sidewall spacers occurs after placing the source/drain implants into the substrate.

3. The method as recited in claim 2 further including annealing the source/drain implants to form source/drain regions after removing the at least the portion of the horizontal segment of the L-shaped sidewall spacers.

4. The method as recited in claim 2 further including annealing the source/drain implants to form source/drain regions before removing the at least the portion of the horizontal segment of the L-shaped sidewall spacers.

5. The method as recited in claim 1 wherein the removing the at least the portion of the horizontal segment of the L-shaped sidewall spacers occurs before placing the source/drain implants into the substrate.

6. The method as recited in claim 1 further including forming silicided active regions in the source/drain regions.

7. The method as recited in claim 1 wherein the L-shaped sidewall spacers are source/drain sidewall spacers and wherein placing source/drain implants into the substrate proximate the gate structure includes placing deep source/drain implants into the substrate proximate the gate structure.

8. The method as recited in claim 7 further including forming source/drain extension implants into the substrate prior to the L-shaped sidewall spacers being formed.

9. The method as recited in claim 1 wherein removing the at least the portion of the horizontal segment of the L-shaped sidewall spacers includes removing up to about 30 nm of each of the horizontal segments of the L-shaped sidewall spacers.

10. The method as recited in claim 9 wherein removing up to about 30 nm of each of the horizontal segments of the L-shaped sidewall spacers includes removing from about 5 nm to about 10 nm of each of the horizontal segments of the L-shaped sidewall spacers.

11. The method as recited in claim 1 wherein the L-shaped sidewall spacers comprise a nitride.

12. The method as recited in claim 1 wherein the removing the at least the portion of the horizontal segment of the sidewall spacers includes removing the at least the portion using a wet etch.

13. The method as recited in claim 12 wherein the wet etch includes a combination of hydrofluoric acid and ethylene glycol.

14. The method as recited in claim 12 wherein the wet etch includes hot phosphoric acid.

15. The method as recited in claim 1 wherein the step of etching the sidewall oxides is directly after the step of removing at least a portion of a horizontal segment of the L-shaped sidewall spacers.

16. A method for manufacturing an integrated circuit, comprising:
   forming semiconductor devices over a substrate, including;
      forming a gate structure over the substrate, the gate structure having L-shaped sidewall spacers on opposing sidewalls thereof, the gate structure also having sidewall oxides coupled to the L-shaped sidewall spacers;
      placing source/drain implants into the substrate proximate the gate structure; and
      removing at least a portion of a horizontal segment of the L-shaped sidewall spacers, wherein the L-shaped sidewall spacers are still L-shaped after the removing step;
      etching the sidewall oxides after the step of removing at least a portion of a horizontal segment of the L-shaped sidewall spacers, wherein the outside edge of the etched sidewall oxides does not extent past the outside edge of the horizontal segment of the L-shaped sidewall spacers;
   forming dielectric layers over the semiconductor devices; and
   forming interconnects within the dielectric layers for contacting the semiconductor devices and thereby forming an operational integrated circuit.

17. The method as recited in claim 16 wherein the removing the at least the portion of the horizontal segment of the L-shaped sidewall spacers occurs after placing the source/drain implants into the substrate.

18. The method as recited in claim 17 further including annealing the source/drain implants to form source/drain regions after removing the at least the portion of the horizontal segment of the L-shaped sidewall spacers.

19. The method as recited in claim 17 further including annealing the source/drain implants to form source/drain regions before removing the at least the portion of the horizontal segment of the L-shaped sidewall spacers.

20. The method as recited in claim 16 wherein the removing the at least the portion of the horizontal segment of the L-shaped sidewall spacers occurs before placing the source/drain implants into the substrate.

21. The method as recited in claim 16 further including forming silicided active regions in the source/drain regions.

22. The method as recited in claim 16 wherein the L-shaped sidewall spacers are source/drain sidewall spacers and wherein placing source/drain implants into the substrate proximate the gate structure includes placing deep source/drain implants into the substrate proximate the gate structure.

23. The method as recited in claim 22 further including forming source/drain extension implants into the substrate prior to the L-shaped sidewall spacers being formed.

24. The method as recited in claim 16 wherein removing the at least the portion of the horizontal segment of the L-shaped sidewall spacers includes removing up to about 30 nm of each of the horizontal segments of the L-shaped sidewall spacers.

25. The method as recited in claim 24 wherein removing up to about 30 nm of each of the horizontal segments of the L-shaped sidewall spacers includes removing from about 5 nm to about 10 nm of each of the horizontal segments of the L-shaped sidewall spacers.

26. The method as recited in 16 wherein the L-shaped sidewall spacers comprise a nitride.

27. The method as recited in claim 16 wherein the removing the at least the portion of the horizontal segment of the sidewall spacers includes removing the at least the portion using a wet etch.

28. The method as recited in claim 27 wherein the wet etch includes a combination of hydrofluoric acid and ethylene glycol.

29. The method as recited in claim 27 wherein the wet etch includes hot phosphoric acid.

30. The method as recited in claim 16 wherein the step of etching the sidewall oxides is directly after the step of removing at least a portion of a horizontal segment of the L-shaped sidewall spacers.

* * * * *